(12) United States Patent
Imangholi et al.

(10) Patent No.: US 9,525,111 B2
(45) Date of Patent: Dec. 20, 2016

(54) DIE EMITTING WHITE LIGHT

(71) Applicant: BRIDGELUX, INC., Livermore, CA (US)

(72) Inventors: Babak Imangholi, Pleasanton, CA (US); Khashayar Phil Oliaei, San Ramon, CA (US); Scott West, Pleasanton, CA (US)

(73) Assignee: Bridgelux, Inc., Livermore, CA (US)

( * ) Notice: Subject to any disclaimer, the term of this patent is extended or adjusted under 35 U.S.C. 154(b) by 0 days.

(21) Appl. No.: 15/151,407

(22) Filed: May 10, 2016

(65) Prior Publication Data

US 2016/0254419 A1    Sep. 1, 2016

Related U.S. Application Data

(62) Division of application No. 14/046,644, filed on Oct. 4, 2013, now Pat. No. 9,356,201.

(51) Int. Cl.
| | |
|---|---|
| *H01L 33/00* | (2010.01) |
| *H01L 33/50* | (2010.01) |
| *H01L 33/56* | (2010.01) |
| *H01L 33/62* | (2010.01) |

(52) U.S. Cl.
CPC ............ *H01L 33/502* (2013.01); *H01L 33/56* (2013.01); *H01L 33/62* (2013.01); *H01L 2933/005* (2013.01); *H01L 2933/0041* (2013.01); *H01L 2933/0066* (2013.01)

(58) Field of Classification Search
CPC .... H01L 25/167; H01L 33/0079; H01L 33/02; H01L 33/18; H01L 33/40; H01L 33/46; H01L 33/486; H01L 33/53; H01L 33/58; H01L 33/502; H01L 33/56; H01L 33/62
USPC .................................................. 257/80–103
See application file for complete search history.

(56) References Cited

U.S. PATENT DOCUMENTS

2007/0259206 A1    11/2007   Oshio
2012/0068208 A1    3/2012    Tseng et al.

*Primary Examiner* — Brook Kebede
(74) *Attorney, Agent, or Firm* — Arent Fox LLP

(57) ABSTRACT

Various methods and apparatuses are disclosed. A method may include disposing at least one die on a location on a carrier substrate, forming at least one stud bump on each of at least one die, forming a phosphor layer on the at least one stud bump and the at least one die, removing a top portion of the phosphor layer to expose the at least one stud bump, and removing a side portion of the phosphor layer located between two adjacent dies. An apparatus may include a die comprising top, bottom, and side surfaces. A phosphor layer may be disposed on the top, bottom, and side surfaces of the die. The phosphor layer may have substantially equal thicknesses on the top and side surfaces of the die as well as one or more stud bumps disposed on the top surface of the die.

13 Claims, 9 Drawing Sheets

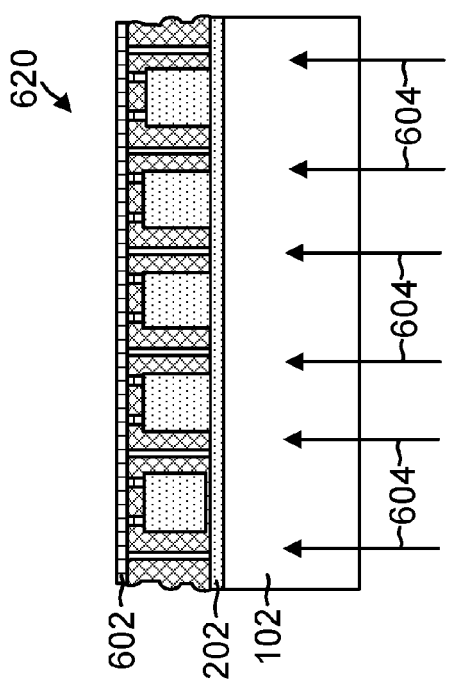
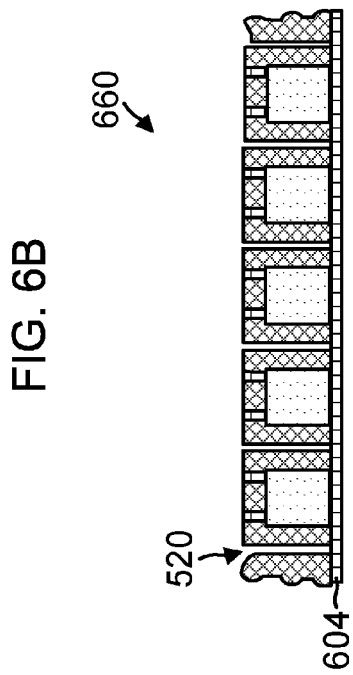
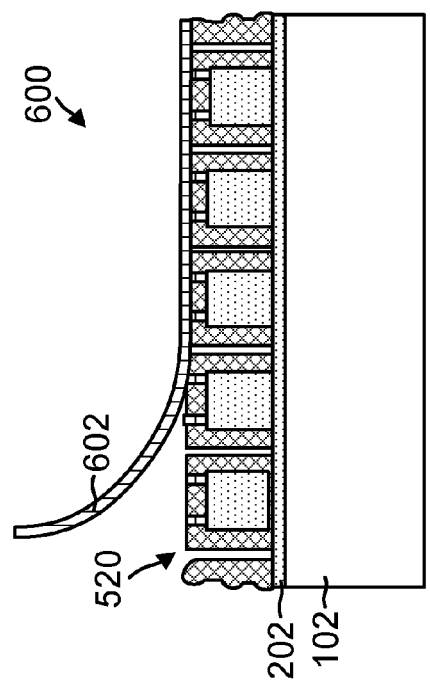
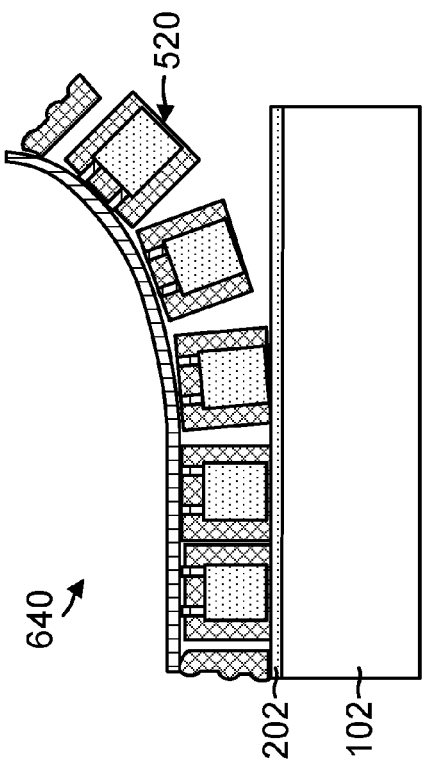
FIG. 6A
FIG. 6B
FIG. 6C
FIG. 6D

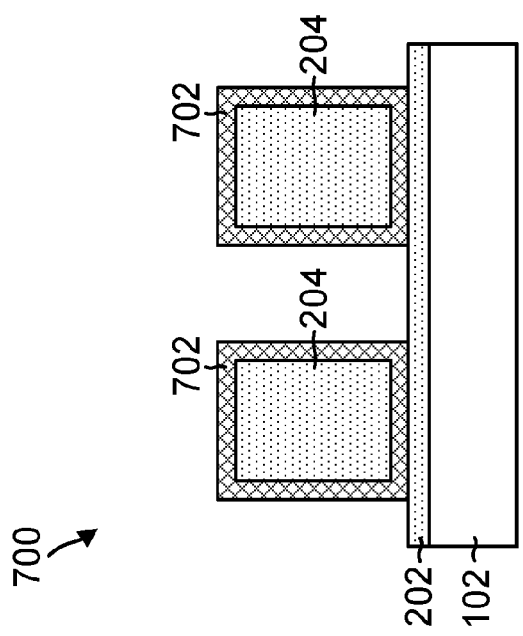
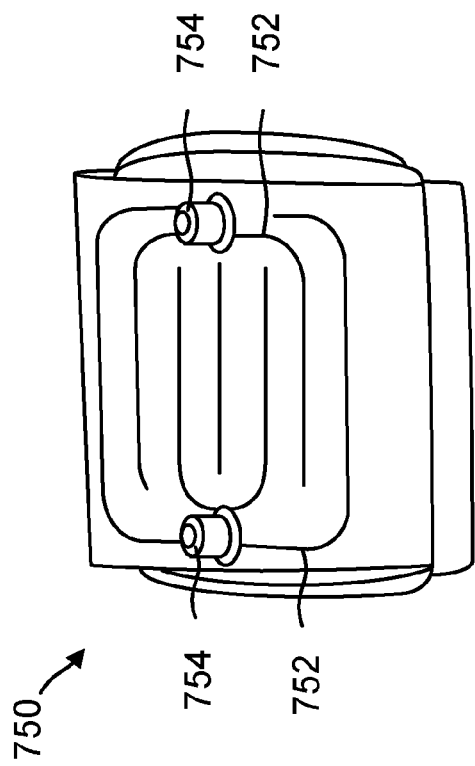
FIG. 7A
FIG. 7B

DIE EMITTING WHITE LIGHT

CROSS-REFERENCE TO RELATED APPLICATIONS

This Application is a divisional of U.S. patent application Ser. No. 14/046,644 entitled "DIE EMITTING WHITE LIGHT," filed Oct. 4, 2013, allowed, the contents of which are hereby incorporated by reference herein their entirety.

BACKGROUND

1. Field

The present disclosure relates generally to a light emitting device and, more particularly, to a die emitting white light.

2. Background

A light emitting device may include one or more dies that emit light of various colors. In some configurations, a die may emit blue light. When blue light passes through a phosphor layer, the blue light may be converted to white light. Varying thicknesses of the phosphor layer may cause the blue light to be converted to varying shades of white light. In some applications, variations in the shade of the white light may be undesirable. To prevent variations in the shade of the white light, the phosphor layer should be uniform. Accordingly, there is a need for an improved white light emitting die having a uniform layer of phosphor surrounding the light emitting portions of the die.

SUMMARY

Several aspects of the present invention will be described more fully hereinafter with reference to various embodiments of LED dies that emit white light and methods used to fabricate LED dies that emit white light.

One aspect of a method used to fabricate LED dies that emit white light is disclosed. A method may include disposing at least one die on a location on a carrier substrate based on fiducial markings on the carrier substrate, forming at least one stud bump on each of at least one die, forming a phosphor layer on the at least one stud bump and the at least one die, removing a top portion of the phosphor layer to expose the at least one stud bump, and removing a side portion of the phosphor layer located between two adjacent dies.

One aspect of LED dies that emit white light is disclosed. An apparatus may include a die comprising a top surface and a side surface, a phosphor layer disposed on the top surface and the side surface of the die, the phosphor layer having substantially equal thickness on the top and side surfaces of the die, and one or more stud bumps disposed on the top surface of the die.

Another aspect of LED dies that emit white light is disclosed. An apparatus may include means for disposing at least one die on a location on a carrier substrate based on fiducial markings on the carrier substrate, means for forming at least one stud bump on each of at least one die, means for forming a phosphor layer on the at least one stud bump and the at least one die, means for removing a top portion of the phosphor layer to expose the at least one stud bump, and means for removing a side portion of the phosphor layer located between two adjacent dies.

It is understood that other aspects of apparatuses and methods will become readily apparent to those skilled in the art from the following detailed description, wherein various aspects of apparatuses and methods are shown and described by way of illustration. As will be realized, these aspects may be implemented in other and different forms and its several details are capable of modification in various other respects. Accordingly, the drawings and detailed description are to be regarded as illustrative in nature and not as restrictive.

BRIEF DESCRIPTION OF THE DRAWINGS

Various aspects of apparatuses and methods will now be presented in the detailed description by way of example, and not by way of limitation, with reference to the accompanying drawings, wherein:

FIGS. 6A-6D are side view illustrations showing the removal of the dies from the carrier substrate.

FIG. 7A is a side view illustration showing an example of dies having a phosphor layer on top, bottom and side surfaces.

FIG. 7B is a top view illustration of an example circuitry providing current to the dies.

DETAILED DESCRIPTION

Figure 1A:
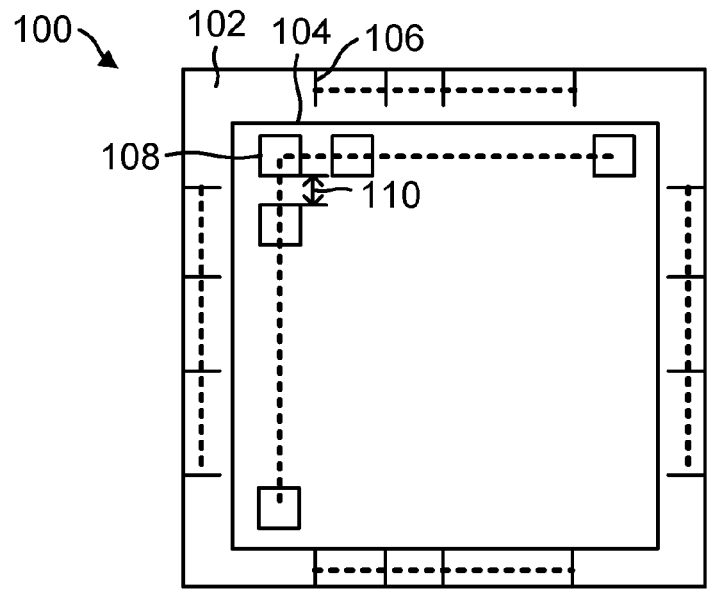
FIG. 1A is a top view illustration of a carrier substrate.

Various aspects of the disclosure will be described more fully hereinafter with reference to the accompanying drawings. This disclosure may, however, be embodied in many different forms by those skilled in the art and should not be construed as limited to any specific structure or function presented herein. Rather, these aspects are provided so that this disclosure will be thorough and complete, and will fully convey the scope of the disclosure to those skilled in the art. Based on the teachings herein, one skilled in the art should appreciate that the scope of the disclosure is intended to cover any aspect of this disclosure, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure and/or functionality in addition to or instead of other aspects of this disclosure. It should be understood that any aspect of the disclosure disclosed herein may be embodied by one or more elements of a claim.

Although particular aspects will be described herein, many variations and permutations of these aspects fall within the scope of the disclosure. Although some benefits and advantages of the preferred aspects are mentioned, the scope of the disclosure is not intended to be limited to particular benefits, uses, or objectives. Rather, aspects of the disclosure are intended to be broadly applicable to different circuits, technologies, systems, networks, and methods, some of which are illustrated by way of example in the drawings and in the following description. The detailed description and drawings are merely illustrative of the disclosure rather than limiting, the scope of the disclosure being defined by the appended claims and equivalents thereof.

Figure 1B:
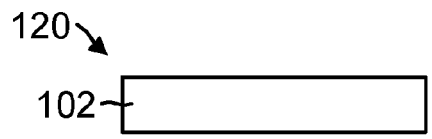
FIG. 1B is a side view illustration of the carrier substrate.

FIG. 1A is a top view illustration 100 of a carrier substrate 102. FIG. 1B is a side view 120 illustration of the carrier substrate 102. The carrier substrate 102 may be constructed from quartz, invar, or glass, or any other material with low expansion in the presence of heat. The carrier substrate 102 may have a number of fiducial markings 104, 106, 108. A fiducial marking 104, 106, 108 may be a reference point with tolerances of +/−0.25 microns. A camera (not shown) may detect the presence and location of the fiducial marking 104, 106, 108 on the carrier substrate 102. A processing system (not shown) associated with the camera may perform certain operations based on the detected fiducial markings 104, 106, 108. In some embodiments, different fiducial markings are used for different operations. For example, one fiducial marking can be used for placing die onto the carrier substrate, another fiducial marking can be used for laser ablation, and another fiducial marking can be used for cutting the carrier. In other embodiments, a single fiducial marking can be used for multiple operations. For example, in some embodiments, a single fiducial marking can be used for placing the die, laser ablation, and dicing.

In one embodiment, fiducial marking 108 is used to determine the specific location to place a die. For example, the camera may detect fiducial marking 108 and the processing system may determine that one or more dies are to be disposed inside of the region defined by the fiducial marking 108. After the camera detects fiducial marking 108, the processing system may instruct a mechanical apparatus (not shown) associated with the processing system to dispose (i.e., pick-and-place) a die inside of the region defined by fiducial marking 108.

After the dies are disposed on the carrier substrate, laser ablation or saw cutting may be performed with respect to a region/distance 110 between fiducial markings 108, as will be discussed further below with respect to FIG. 5A. For example, the camera may detect fiducial markings 106, and the computer system may determine the location to perform laser ablation based on fiducial markings 106, as will be discussed further below with respect to FIG. 5A. Because phosphor may be added on/around the dies located within fiducial markings 108, fiducial markings 108 may be covered with phosphor and thereby not visible to the camera when the processing system is determining the location to perform laser ablation or saw cutting. Because fiducial markings 106 are located at the periphery of the carrier substrate 102, fiducial markings 106 are less likely to be covered with phosphor (which is added on/around fiducial markings 108) and thereby more likely to be visible to the camera when the processing system is determining the location to perform laser ablation.

Figure 2A:
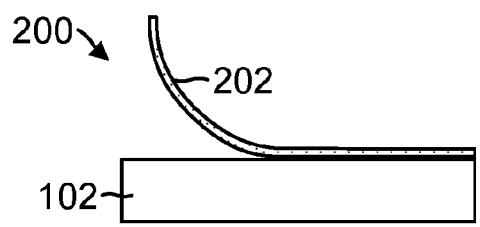
FIGS. 2A and 2B are side view illustrations before and after dies are placed on the carrier substrate, respectively.

FIG. 2A is a side view illustration 200 of the carrier substrate 102 before any dies are placed on the carrier substrate 102. In some embodiments, before any dies are placed on the carrier substrate 102, a transparent tape 202 is formed on the carrier substrate 102. Because the transparent tape 202 is transparent, the fiducial markings 104, 106, 108 on the carrier substrate 102 may be visible to a camera even after the transparent tape 202 is added to the carrier substrate 102 (see FIG. 1A). The transparent tape 202 may have adhesive properties, which may allow the transparent tape 202 to adhere to the carrier substrate 102. The thickness of the transparent tape 202 may be highly uniform such that the top of each die 204 is substantially coplanar with the top of each other die 204.

Figure 2B:
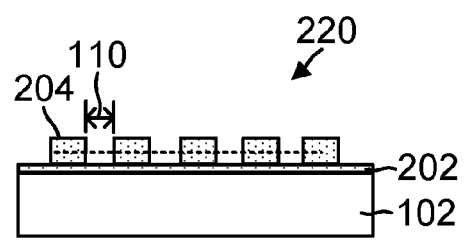

FIG. 2B is a side view illustration 220 of the carrier substrate 102 after dies 204 are placed on the carrier substrate 102. Dies 204 may be separated by a region/distance 110. The transparent tape 202 may also have adhesive properties that allow the dies 204 to adhere to the transparent tape 202. As will be discussed with respect to FIG. 6B, the adhesive strength of the transparent tape 202 may diminish when exposed to ultraviolet (UV) light, thereby allowing the transparent tape 202 to separate from the carrier substrate 102 and/or dies 204.

Figure 3:
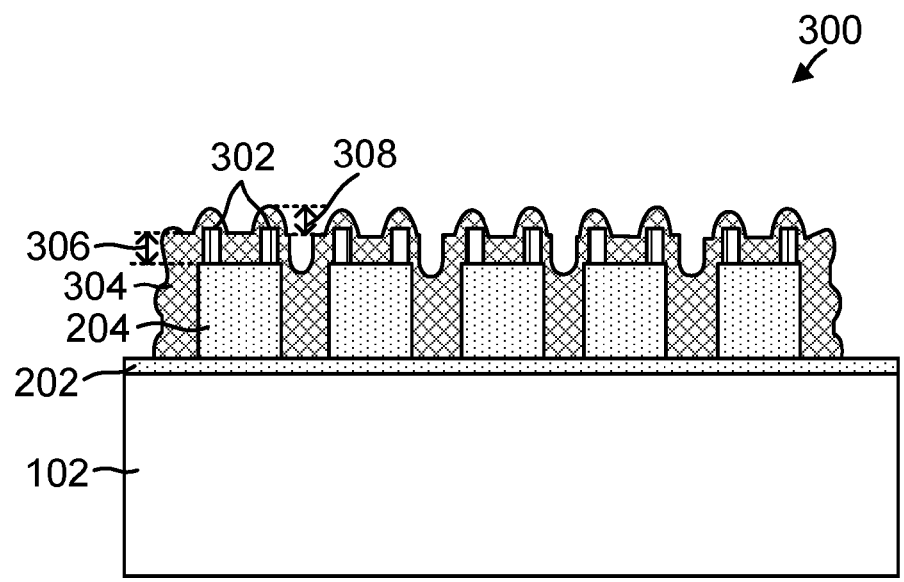
FIG. 3 is a side view illustration of dies after phosphor is formed on the dies.

FIG. 3 is a side view illustration 300 of the carrier substrate 102 after stud bumps 302 and a phosphor layer 304 have been formed on the dies 204. Each die 204 may have one or more stud bumps 302 formed on the die 204. A stud bump 302 may have gold, copper, or any other non-corroding metal. The stud bump 302 may provide an electrical connection between the die 204 and fingers 752 that provide connectivity to a current source 754 (see FIG. 7B).

The quantity, metal-type, and width of the stud bump may affect the rate that current can be provided to the die 204. Further, each carrier substrate 102 may hold one or more dies 204. Although some of the examples described herein include five dies 204 and two stud bumps 302 for each die 204, one or ordinary skill in the art will appreciate that alternative examples with different numbers of dies 204 and stud bumps 302 may be implemented without deviating from the scope of the present disclosure.

After at least one stud bump 302 has been formed on the dies 204, a phosphor layer 304 may be formed on the dies 204 and stud bumps 302. As shown in the embodiment illustrated in FIG. 3, the phosphor layer 304 may be formed by spraying a layer of phosphor on the dies 204 and stud bumps 302. As illustrated in FIG. 3, the phosphor layer 304 conforms to the shape of the dies 204 and stud bumps 302. In some embodiments, the phosphor layer 304 may be formed by forming a conformal phosphor layer on the dies 204 and stud bumps 302. In other embodiments, the phosphor layer 304 may be formed by applying a phosphor sheet over the dies 204 and stud bumps 302.

Each stud bump 302 may have substantially the same height 306. The phosphor layer 304 may have a thickness 308 that is equal to or greater than the height of the stud bumps 302. A purpose for the thickness of the phosphor layer 304 being equal to the height of the stud bumps 302 will be discussed with respect to FIG. 4.

After the phosphor layer 304 is formed on the dies 204 and stud bumps 302, the phosphor layer 304 may be cured using various techniques known by one of ordinary skill in the art. After the phosphor layer is cured, a top portion of the phosphor layer 304 may be removed, as is discussed with respect to FIG. 4.

Figure 4:
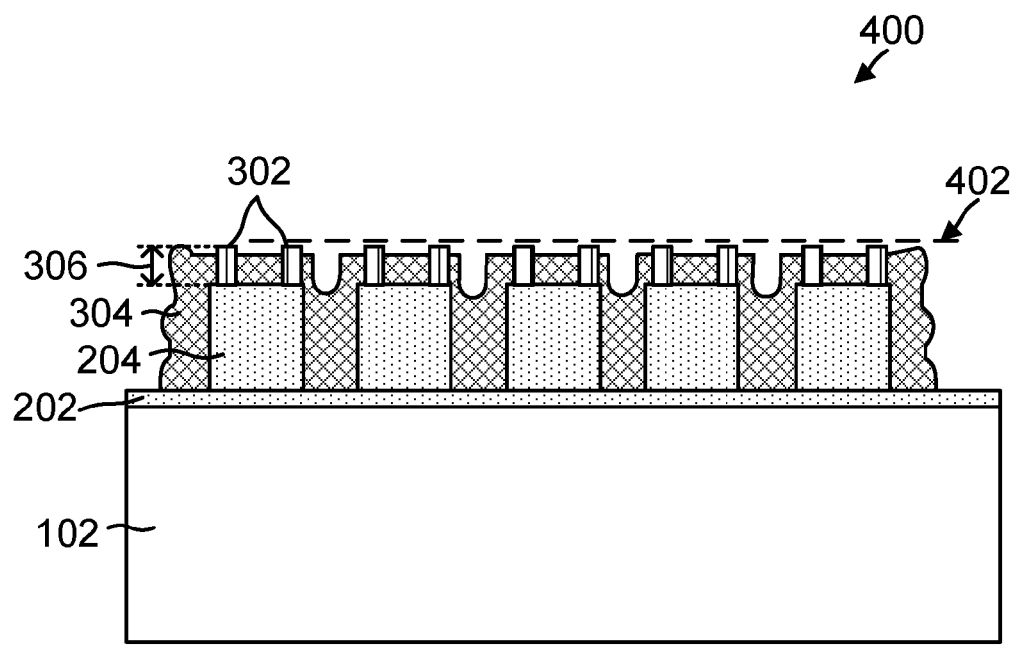
FIG. 4 is a side view illustration of dies after a top portion of the phosphor is removed.

FIG. 4 illustrates a side view illustration 400 after a top portion of the phosphor layer 304 has been removed. A purpose of removing the top portion of the phosphor layer is to expose the top of the stud bumps 302 such that an electrical connection can eventually be made between the stud bumps 302 and the fingers 752 connected to the current source 754 (see FIG. 7B). As shown in the embodiment illustrated in FIG. 4, the top portion of the phosphor layer may be removed using a lapping procedure that laps a top portion of the phosphor layer and, possibly, the stud bumps 302. Lapping may involve grinding, cutting, or otherwise removing a portion of the phosphor layer 304 and, possibly, the stud bumps 302. Lapping may be performed along the plane 402, as illustrated in FIG. 4. By lapping the top portion of the phosphor layer 304 along a single plane 402, the height 306 of the phosphor layer on the top of the dies 204 may be substantially equal among the various dies 204 on the carrier substrate 102. Also, since the height 308 of the phosphor layer 304 is equal to at least the height 306 of the stud bumps 302, as previously discussed with respect to FIG. 3, the thickness 306 of the phosphor layer 304 after the top portion of the phosphor layer 304 is removed will be substantially equal among the various dies 204 on the carrier substrate 102.

As a result of the lapping procedure, a small portion of the top segment of the stud bumps 302 may protrude above the top of the phosphor layer 304. In some embodiments, the top portion of the phosphor layer 304 may be removed using laser ablation. If laser ablation is used to remove a top portion of the phosphor layer 304, the stud bumps 302 may remain uncut (unlike lapping, which may result in cutting/grinding/polishing of a top portion of the stud bumps 302, as previously discussed). Also, if laser ablation is used, the top segment of the stud bump 302 may not protrude above the top of the phosphor layer 304.

Figure 5A:
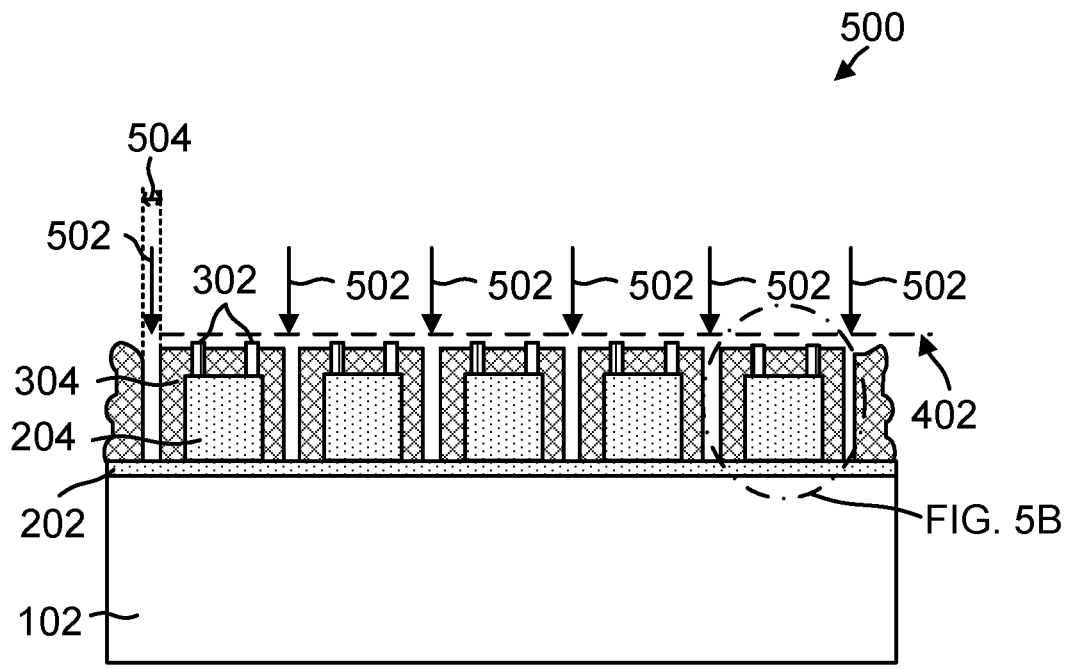
FIG. 5A is a side view illustration of dies after a side portion of the phosphor is removed.
Figure 5B:
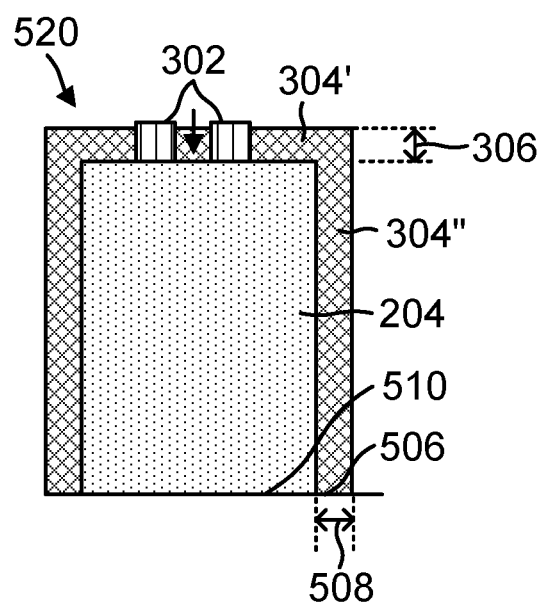
FIG. 5B is an enlarged side view illustration of one of the dies illustrated in FIG. 5A.

FIG. 5A is a side view illustration 500 after a side portion of the phosphor layer 304 has been removed. FIG. 5B is an enlarged side view illustration of one phosphorized die 520. As illustrated in the embodiment illustrated in FIG. 5A, laser ablation 502 may be used to remove the side portion of the phosphor layer 304. The location where laser ablation 502 may be performed may be based on the fiducial marks (e.g., 106 in FIG. 1A) on the carrier substrate 102. For example, a camera may detect the location of the fiducial mark 106 on the periphery of the carrier substrate, and a processing system associated with the camera may determine the location to perform the laser ablation 502.

After the location to perform laser ablation 502 has been determined, laser ablation 502 can be performed to remove a side portion of the phosphor layer 304. The removed side portion begins from the top portion of the phosphor layer 304 and may extend to the bottom portion of the phosphor layer 304. As illustrated in FIG. 5A, laser ablation may not remove any portion of the transparent tape 202 and/or carrier substrate 102.

The die 204 may emit a particular color of light (e.g., blue light). As that emitted light travels through the phosphor layer 304, the color of the light may convert to a different color (e.g., white light). Different thicknesses of the phosphor layer may result in different shades of white light. Accordingly, a phosphor layer 304 with uniform thickness may allow the die to emit a single shade of white light. As previously discussed, uniform thickness of the phosphor layer 304 may be desirable.

The top portion 304' and side portion 304" of the phosphor layer have respective thicknesses of 306 and 508. To achieve a phosphor layer 304 with uniform thickness, the thickness 306 of the top portion 304' should be substantially equal to the thickness 508 of the side portion 304".

The width 504 of the removed side portion of the phosphor layer 304 may be based on the region/distance 110 between two adjacent dies 204 (see FIGS. 1A, 1B). There may be an inverse relationship between width 504 and region/distance 110. As the region/distance 110 increases, the width 504 of the removed side portion of the phosphor layer 304 may increase in order to provide a die 204 with a uniform layer of phosphor 304.

As a result of laser ablation 502, burn marks may form in areas where laser ablation 502 was performed. For example, a side surface of the phosphor layer 304" may have a burn mark indicating laser ablation 502. In some embodiments, the burn marks may extend between a top portion of the side surface of the phosphor layer 304' and a bottom portion of the side surface of the phosphor layer 304'. In some embodiments, the burn marks have a color that is different from a color of the phosphor layer 304', 304".

In some embodiments, the burn marks are unassociated with the stud bumps 302. As previously discussed with respect to FIG. 4, laser ablation may be used to remove a top portion of the phosphor layer in order to expose the stud bump(s) 302. When laser ablation is used to remove a top portion (i.e., not a side portion) of phosphor located above a stud bump 302, the burn mark may be associated with the stud bump 302. However, when laser ablation is used to remove a portion of phosphor located between two adjacent dies, as discussed with respect to FIG. 5A, the burn mark may be located sufficiently distant from the stud bumps 302 so as to be unassociated with the stud bumps 302.

The side surface of the phosphor layer 304" may have a thickness tolerance that is less than 25 microns. The top surface of the phosphor layer 304' may have a thickness tolerance less than 25 microns.

As a result of laser ablation or saw cutting, the bottom 510 of the die 204 and the bottom 506 of the phosphor layer may be coplanar, as illustrated in FIG. 5B. If laser ablation 502 is not used to remove the phosphor between two adjacent dies 204 (e.g., two adjacent dies 204 are separated by cutting or precision sawing), the bottom 510 of the die 204 and the bottom 506 of the phosphor layer 304 may not be coplanar.

FIGS. 6A-6D are side view illustrations 600, 620, 640, 660 showing the removal of the dies 204 from the carrier substrate 102. After laser ablation or saw-cutting is performed, a top tape 602 may be attached to a top side of the phosphorized dies 520, as shown in the illustration 600 in FIG. 6A. After the top tape 602 attaches to the phosphorized dies 520, UV light 604 may be applied through the carrier substrate 102, as shown in the illustration 620 in FIG. 6B. As previously discussed, UV light may cause the strength of the adhesive properties of the transparent tape 202 to decrease to an extent that will allow the phosphorized dies 520 to be removed from the transparent tape 202, as shown in the illustration 640 in FIG. 6C. The carrier substrate 102 may be reused/recycled in the apparatuses and methods disclosures herein. Afterwards, as shown in the illustration 660 in FIG. 6D, a bottom tape 604 may be applied to a bottom side of the phosphorized dies 520, and the top tape 602 may be detached from the phosphorized dies 520. The bottom tape 604 may sometimes be referred to as a 'blue tape.'

FIG. 7A is a side view illustration 700 of dies 204 having a phosphor layer 702 on top, bottom, and side surfaces. As illustrated in FIG. 7A, in some configurations, the dies 204 may have a phosphor layer 702 (e.g., conformal phosphor) surrounding the top surface, the bottom surface, and at least one side surface of the dies 204. The phosphor layer 702 on the bottom surface of the dies 204 may contact the tape 202. As previously discussed in greater detail, the tape 202 may separate the dies 204 (and the phosphor layers thereof) from the carrier substrate 102. In some configurations, the carrier substrate 102 may have no fiducial markings, as illustrated in FIG. 7A. In some other configurations, the carrier substrate may have at least some fiducial markings, as illustrated in FIG. 1A.

FIG. 7B is a top view illustration 750 of an example system that may provide current to the phosphorized dies 520. The system may include one or more current sources 754 that each have conductive metal or conductors, sometimes referred to as fingers 752, distributed throughout a region. The fingers 752 may make contact/connections with exposed regions of the stud bumps 302, as previously discussed with respect to FIG. 4.

Figure 8A:
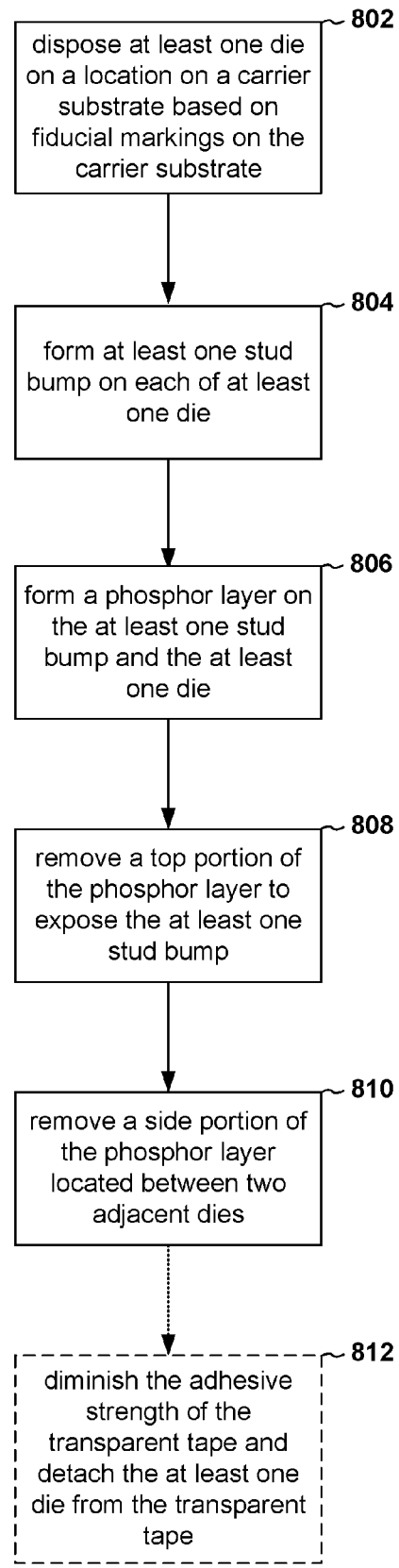
FIGS. 8A-8C are flowcharts illustrating exemplary methods used in fabricating LED dies that emit white light.
Figure 8B:
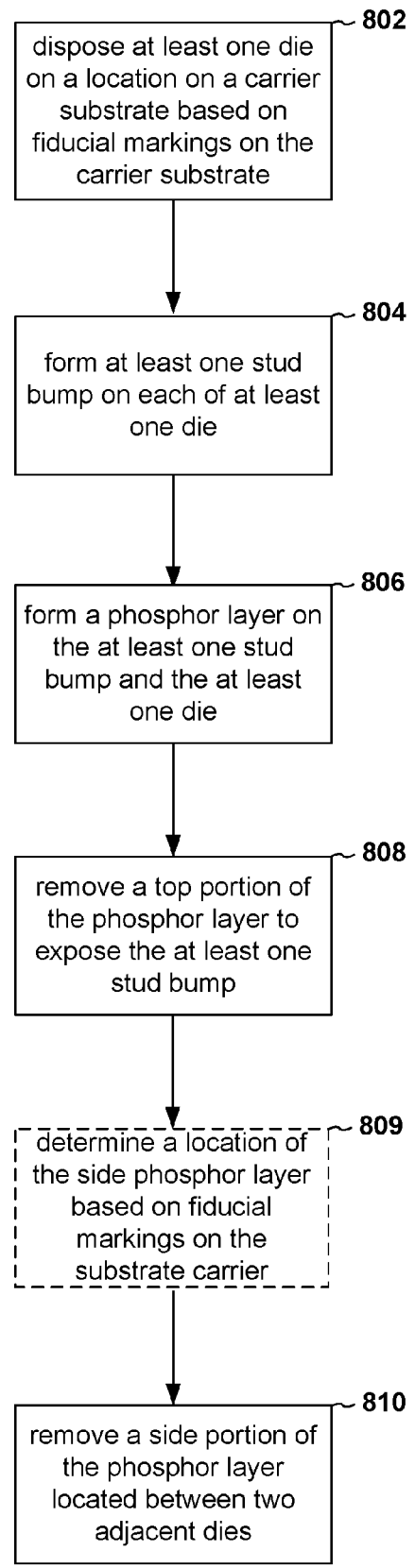
Figure 8C:
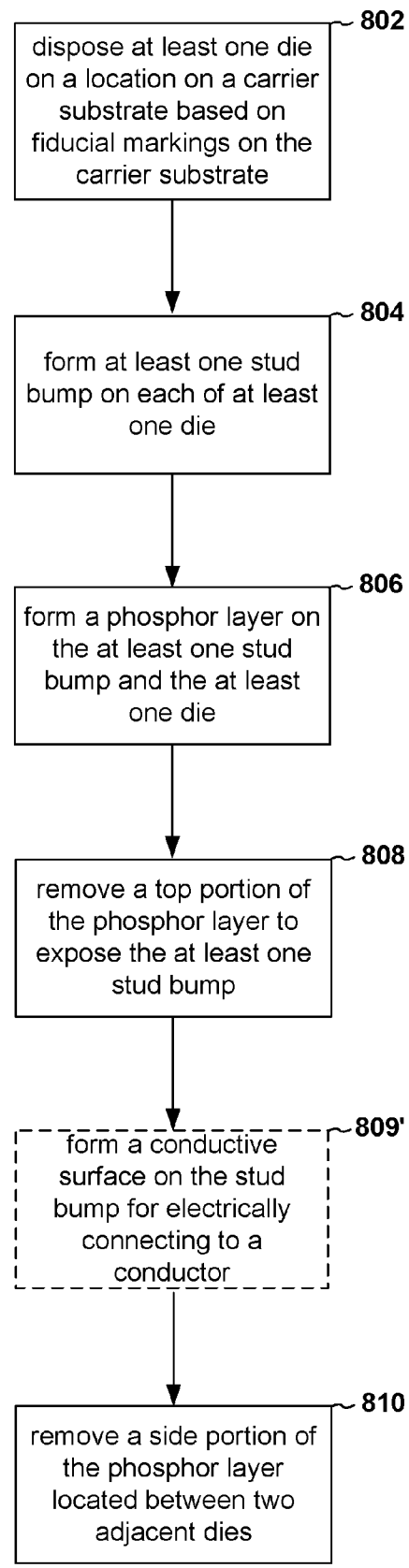

FIGS. 8A-8C are flowcharts illustrating example methods. The example methods may be performed by an apparatus. Referring to FIG. 8A, at 802, the apparatus may dispose at least one die on a location on a carrier substrate based on fiducial markings on the carrier substrate. For example, referring to FIGS. 1A and 3, the apparatus may dispose a die 204 in the region inside of fiducial marking 108 located on carrier substrate 102. At 804, the apparatus may form at least one stud bump on each of at least one die. For example, referring to FIG. 3, the apparatus may form stud bumps 302 on dies 204. At 806, the apparatus may form a phosphor layer on the at least one stud bump and the at least one die. For example, referring to FIG. 3, the apparatus may form phosphor layer 304 on stud bumps 302 and dies 204. At 808, the apparatus may remove a top portion of the phosphor layer to expose the at least one stud bump. For example, referring to FIG. 4, the apparatus may remove a top portion (e.g., any phosphor above plane 402) of phosphor layer 304 to expose the top portion of stud bumps 302. At 810, the apparatus may remove a side portion of the phosphor layer located between two adjacent dies. For example, referring to FIG. 5, the apparatus may remove a side portion of phosphor layer 304 located between two adjacent dies 204.

In some embodiments, the dies may be disposed on a transparent tape 202 (see FIG. 2B). At 812, the apparatus may diminish the adhesive strength of the transparent tape and detach the at least one die from the transparent tape. For example, referring to FIG. 6B, UV light 604 may be applied in order to diminish the adhesive strength of the transparent tape 202. By applying UV light 604, the adhesive strength of the transparent tape 202 may diminish, thereby allowing the dies 204 to detach from the transparent tape 202, as illustrated in FIG. 6C.

FIG. 8B illustrates additional exemplary methods. The methods may be performed by an apparatus. The apparatus may perform the steps 802, 804, 806, 808 as previously discussed with reference to FIG. 8A. In some embodiments, at 809, the apparatus may determine a location of the side phosphor layer based on fiducial markings on the substrate carrier. For example, referring to FIG. 1A, the apparatus may determine the location of the side phosphor layer to remove based on fiducial markings 106 located on the carrier substrate 102. The apparatus may perform the step 810 as previously discussed with reference to FIG. 8A.

FIG. 8C illustrates additional exemplary methods. The methods may be performed by an apparatus. The apparatus may perform the steps 802, 804, 806, 808 as previously discussed with reference to FIG. 8A. In some embodiments, at 809', the apparatus may form a conductive surface on the stud bump for electrically connecting to a conductor. For example, referring to FIGS. 4 and 7, after the top portion of the phosphor layer 304 is removed, the apparatus may form a conductive surface (not shown) on the stud bumps 302 for purposes of electrically connecting the stud bumps 302 to fingers 752. The apparatus may perform the step 810 as previously discussed with reference to FIG. 8A.

The orders or hierarchies of blocks in the processes disclosed in FIGS. 8A-8C are merely illustrations of various examples. Based upon design preferences, the order and/or hierarchies of blocks in the processes may be re-arranged, amended, and/or modified. The accompanying method claims include various limitations related to a process, but the recited limitations are not meant to be limited in any way by the specific order or hierarchy depicted in FIGS. 8A-8C unless expressly stated in the claims.

Figure 9:
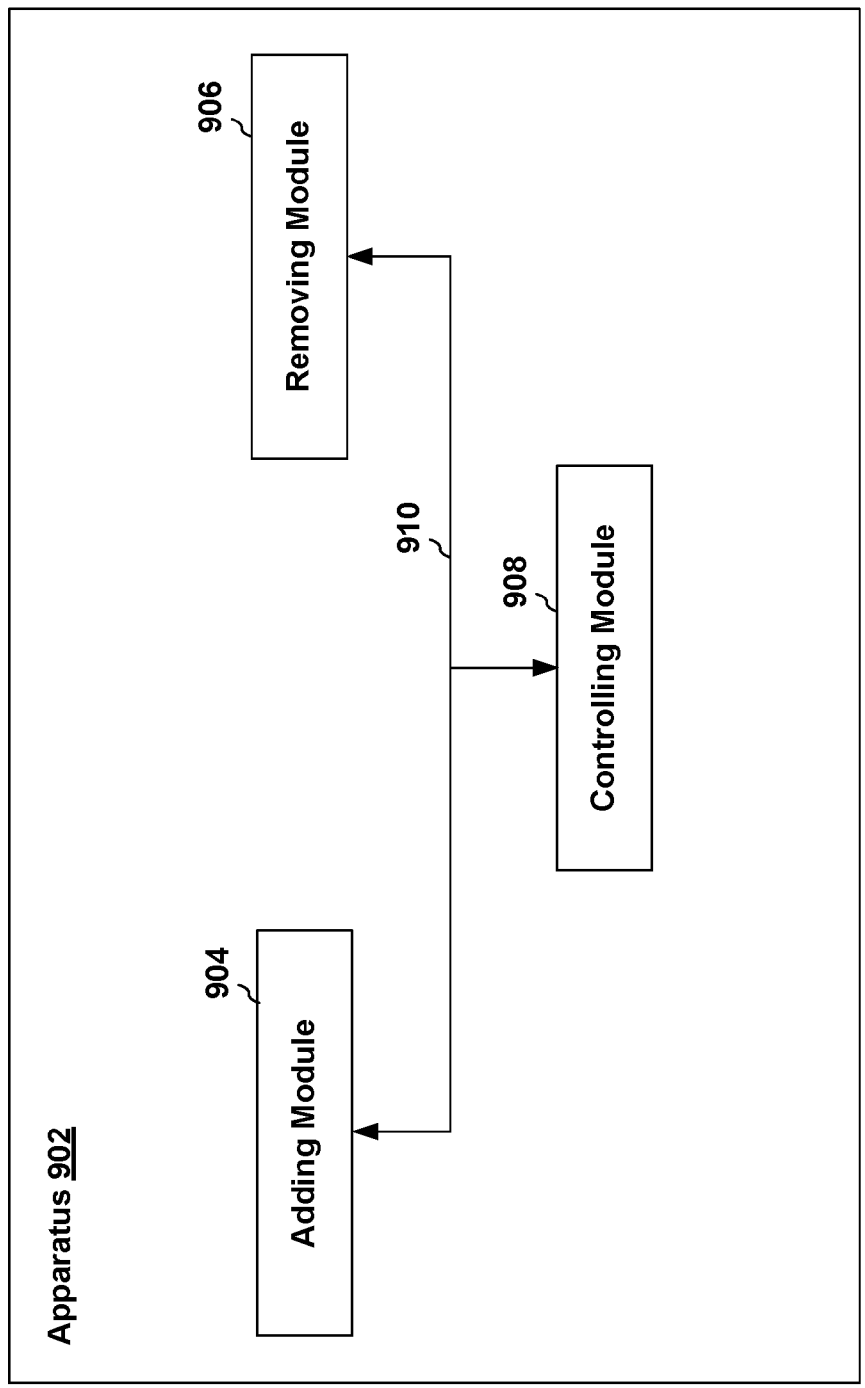
FIG. 9 is a diagram of an apparatus configured to perform various functions to fabricate LED dies that emit white light.

FIG. 9 is a diagram of an apparatus 902 configured to perform various functions. The apparatus 902 may include additional modules that perform each of the steps of the algorithm in the aforementioned flowchart of FIGS. 8A-8C. As such, each step in the aforementioned flowchart of FIGS. 8A-8C may be performed by a module and the apparatus 902 may include one or more of those modules. The modules may be one or more software, hardware and/or mechanical components specifically configured to carry out the stated processes/algorithm, implemented by a processor configured to perform the stated processes/algorithm, stored within a non-transitory computer-readable medium for implementation by a processor, or some combination thereof.

The apparatus 902 may include an adding module 904, a removing module 906, and/or a controlling module 908. A connection/bus 910 may provide interconnectivity between modules 904, 906, 908. For example, the adding module 904 may be any pick-and-place machinery (e.g., AD210 ASM) known to one of ordinary skill in the art. The removing module 906 may be any lapping or grinding machinery known to one of ordinary skill in the art. The removing module 906 may be any laser ablation machinery and/or saw-cutting machinery known to one of ordinary skill in the art. The controlling module 908 may be any processing system known to one of ordinary skill in the art. The processing system may include a processor coupled to computer-readable medium and configured to execute software stored on the computer-readable medium. The computer-readable medium may also be used for storing data that is manipulated by the processor when executing software.

The adding module 904 may be configured to dispose at least one die on a location on a carrier substrate based on fiducial markings on the carrier substrate. The adding module 904 may be configured to form at least one stud bump on each of at least one die. The adding module 904 may be configured to form a phosphor layer on the at least one stud bump and the at least one die. The removing module 906 may be configured to remove a top portion of the phosphor layer to expose the at least one stud bump. The removing module 906 may be configured to remove a side portion of the phosphor layer located between two adjacent dies.

In some embodiments, the controlling module 908 may be configured to determine a location of the side phosphor layer based on fiducial markings on the substrate carrier.

In some embodiments, the adding module 904 may be configured to dispose the at least one die on a transparent tape. After removing the side portion of the phosphor layer, the controlling module 908 may be configured to diminish the adhesive strength of the transparent tape and the removing module 906 may be configured to detach the at least one die from the transparent tape.

The apparatus 902 has already been described in detail. The apparatus 902, in addition or by virtue of the modules 904, 906, 908 of the apparatus 902, provide(s) the corresponding structure(s) for the functions described herein.

The apparatus 902 may provide a means for disposing at least one die on a location on a carrier substrate based on fiducial markings on the carrier substrate. The apparatus 902 may also provide a means for forming at least one stud bump on each of at least one die. The apparatus 902 may also provide a means for forming a phosphor layer on the at least one stud bump and the at least one die. The apparatus 902 may also provide a means for removing a top portion of the phosphor layer to expose the at least one stud bump. The apparatus 902 may also provide a means for removing a side portion of the phosphor layer located between two adjacent dies.

In some embodiments, the apparatus 902 may also provide a means for determining a location of the side phosphor layer based on fiducial markings on the substrate carrier.

In some embodiments, the apparatus 902 may also provide a means for disposing the at least one die on a transparent tape. The apparatus 902 may also provide a means for diminishing the adhesive strength of the transparent tape and detaching the at least one die from the transparent tape after removing the side portion of the phosphor layer.

Although various aspects of the present invention have been described as software implementations, those skilled in the art will readily appreciate that the various software modules presented throughout this disclosure may be implemented in hardware, or any combination of software and hardware. Whether these aspects are implemented in hardware or software depends upon the particular application and design constraints imposed on the overall system. Those with ordinary skill in the art may implement the described functionality in varying ways for each particular application, but such implementation decisions should not be interpreted as causing a departure from the scope of the invention.

The foregoing description is provided to enable any person skilled in the art to fully understand the scope of the invention. Modifications to various aspects disclosed herein will be readily apparent to those skilled in the art. Accordingly, the scope of the claims will not be limited to the various exemplary embodiments provided herein.

Reference to an element in the singular is not intended to mean "one and only one" unless specifically stated as such; instead, reference to an element in the singular shall mean "one or more." Unless specifically stated otherwise, the term "some" refers to one or more. A claim that recites at least one of a combination of elements (e.g., "at least one of A, B, and C") refers to one or more of the recited elements (e.g., A, or B, or C, or any combination thereof).

No claim element is to be construed under the provisions of 35 U.S.C. §112, sixth paragraph, unless the element is expressly recited using the phrase "means for" or, in the case of a method claim, the element is recited using the phrase "step for."

Thus, the claims are not intended to be limited to the various aspects of this disclosure, but are to be accorded the full scope consistent with the language of the claims. All structural and functional equivalents to the various components of the exemplary embodiments described throughout this disclosure that are known to those of ordinary skill in the art are expressly incorporated herein by reference and are intended to be encompassed by the claims.

What is claimed is:

1. A method, comprising:
    disposing at least one die on a location on a carrier substrate;
    forming at least one stud bump on each of at least one die;
    forming a phosphor layer on the at least one stud bump and the at least one die;
    removing a top portion of the phosphor layer to expose the at least one stud bump; and
    removing a side portion of the phosphor layer located between two adjacent dies.

2. The method of claim 1, wherein the disposing the at least one die on the location of the carrier substrate is based on fiducial markings on the carrier substrate.

3. The method of claim 1, wherein the carrier substrate comprises at least one of quartz, invar, or glass.

4. The method of claim 1, wherein forming the phosphor layer comprises forming a conformal phosphor layer.

5. The method of claim 1, wherein forming the phosphor layer comprises spraying a layer of phosphor.

6. The method of claim 1, wherein forming the phosphor layer comprises applying a phosphor sheet over the at least one stud bump and the at least one die.

7. The method of claim 1, wherein forming the phosphor layer comprises forming a phosphor layer having a thickness that is equal to or greater than a height of the at least one stud bump.

8. The method of claim 1, wherein removing the top portion of the phosphor layer comprises lapping the phosphor layer.

9. The method of claim 1, wherein removing the top portion of the phosphor layer comprises laser-ablating, mechanically-polishing, or mechanically-cutting the phosphor layer.

10. The method of claim 2, further comprising:
    determining a location of the side phosphor layer based on the fiducial markings on the substrate carrier.

11. The method of claim 1, wherein the phosphor layer on a top surface and a side surface of each die is substantially equal in thickness.

12. The method of claim 1, further comprising:
    disposing the at least one die on a transparent tape; and
    after removing the side portion of the phosphor layer, diminishing an adhesive strength of the transparent tape and detaching the at least one die from the transparent tape.

13. The method of claim 1, wherein removing the top portion of the phosphor layer to expose the at least one stud bump comprises forming a conductive surface on the stud bump for electrically connecting to a conductor.

* * * * *